United States Patent [19]

Kiat-Hup et al.

[11] Patent Number: 5,154,644
[45] Date of Patent: Oct. 13, 1992

[54] EDGE CONNECTOR FOR A PRINTED CIRCUIT CARD

[75] Inventors: Ng Kiat-Hup; Wong Y. Poh, both of Singapore, Singapore

[73] Assignee: Molex Incorporated, Lisle, Ill.

[21] Appl. No.: 821,722

[22] Filed: Jan. 15, 1992

[51] Int. Cl.⁵ .......................................... H01R 13/00
[52] U.S. Cl. .......................................................... 439/630
[58] Field of Search ............................... 439/629-637

[56] References Cited

U.S. PATENT DOCUMENTS 3,790,916 2/1974 Keitel .................................. 439/629
4,767,341 8/1988 Lund .................................... 439/629

Primary Examiner—Joseph H. McGlynn
Attorney, Agent, or Firm—Charles S. Cohen

[57] ABSTRACT

An electrical connector includes a spring contact member mounted in a housing which has an opening for receiving an edge of a printed circuit card. The spring contact member has a contact area urged into electrical connection with a contact pad on the printed circuit card as the edge of the board is inserted into the opening. The spring contact member has a dog-legged portion extending from the contact area in the direction of insertion of the printed circuit card to define a recessed area of the spring contact member facing the board in the opening. The recessed area of the spring contact member is aligned with the contact pad when the printed circuit card is fully inserted into the opening in the housing.

14 Claims, 2 Drawing Sheets

EDGE CONNECTOR FOR A PRINTED CIRCUIT CARD

FIELD OF THE INVENTION

This invention generally relates to the art of electrical connectors and, particularly, to an edge connector for use with a printed circuit board or card having a reset pad.

BACKGROUND OF THE INVENTION

It is known to provide printed circuit card connectors which have spring contact members urged into electrical connection with an input/output means, such as a contact pad on a printed circuit card as the edge of the printed circuit card is inserted into an opening in the connector. The edge of the printed circuit card pushes the spring loaded electrical contact member into a contacting position as the edge of the printed circuit card moves past the contact member.

Usually, a constant interconnection is made between contact areas on the spring contact members and contact pads on the printed circuit card. However, there are applications wherein such edge card connectors and printed circuit cards are used as a reset switch as the printed circuit card is inserted into the opening in the housing. In other words, a contact pad on the printed circuit card may move over and past a contact area on a spring contact member to momentarily establish an interconnection therebetween; the interconnection being "broken" as the contact pad on the printed circuit card moves past the contact area on the spring contact member towards its fully inserted position in the connector opening. An example of such a momentary switch/edge card connector system might be in a printing apparatus wherein it is desired to reset functions of the printer when the printed circuit card is inserted into the edge card connector. For this purpose, one of the contact pads on the printed circuit card and one of the spring loaded contact members of the connector may be designed or designated as the reset interconnection.

One of the problems with using edge card connectors and printed circuit cards as momentary switches of the character described, concerns accidental or unintentional interconnection between the contact pad on the printed circuit card and the contact area on the spring contact member, which would cause a reset to occur. For instance, inadvertent movement or tilting or excessive vibrations of the printed circuit card after insertion into the connector could also cause unintentional interconnection. In the printer example above, an unintentional interconnection would cause the functions of the printer to be reset, possibly in the middle of a printing run or job.

This invention is directed to solving these problems by designing the spring contact member in relation to the contact pad on the printed circuit card to prevent unintentional interengagement therebetween.

SUMMARY OF THE INVENTION

An object, therefore, of the invention is to provide a new and improved edge card connector of the character described.

The invention is designed for use in an electrical connector arrangement in which a spring contact member is mounted in a housing which has an opening for receiving an edge of a printed circuit card. The spring contact member has a contact area urged into electrical connection with a contact pad on the printed circuit card as the edge of the board is inserted into the connector opening.

The invention contemplates that the spring contact member be provided with a dog-legged portion extending from the contact area in the direction of insertion of the printed circuit card, to thereby define a recessed area of the spring contact member facing the board in the opening. The printed circuit card has a contact pad located so that the contact pad is aligned with the recessed area of the spring contact member when the printed circuit card is fully inserted into the opening in the housing.

In the exemplary embodiment, the dog-legged portion of the spring contact member terminates in a distal end which engages a surface on the connector housing to preload the contact member.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 3:
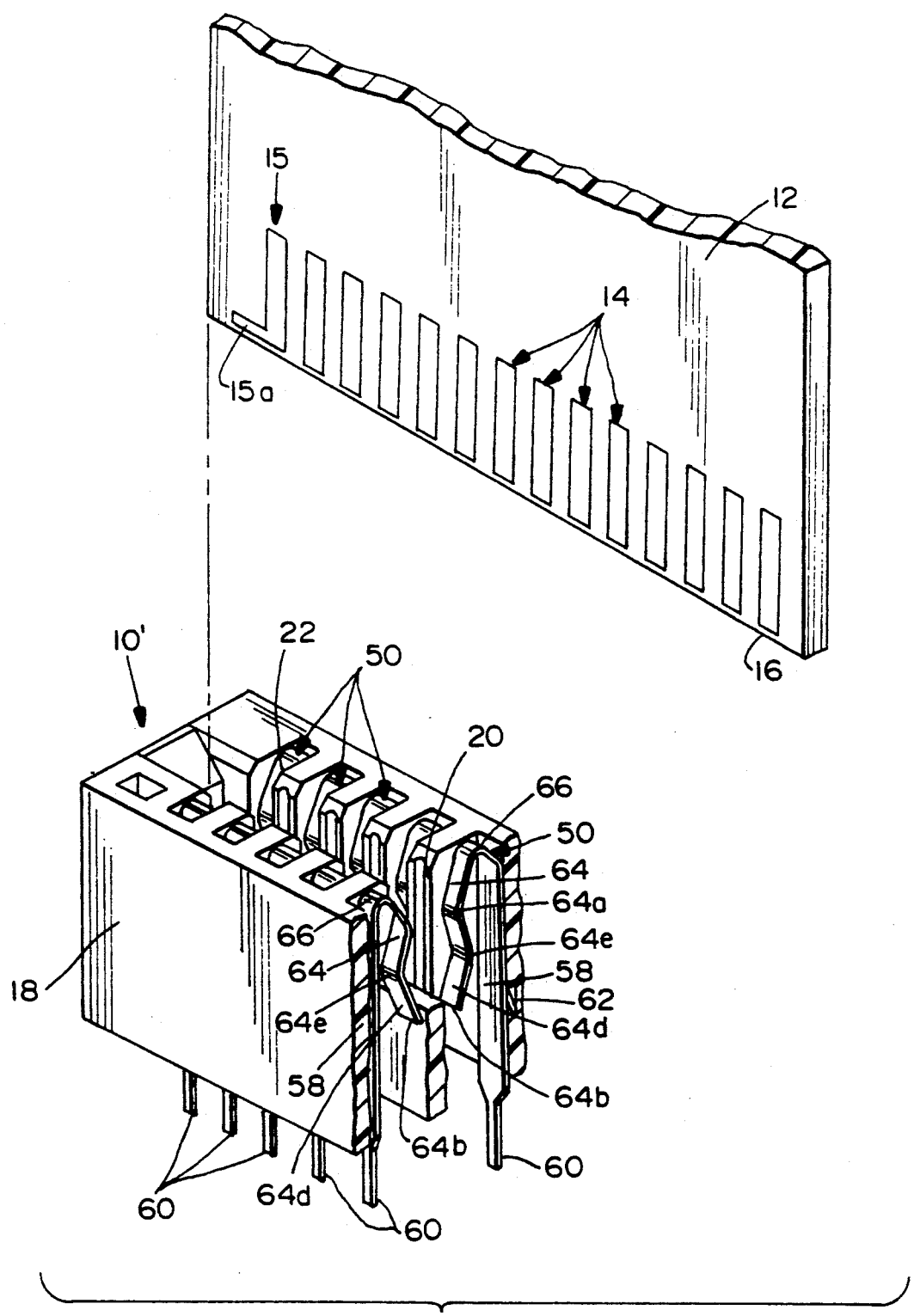
FIG. 3 is an exploded perspective view, partially in section, of an edge card connector of the invention, in conjunction with a mating printed circuit card having a reset pad.

Referring to the drawings in greater detail, and first to FIG. 3 an edge card connector, generally designated 10, is shown in conjunction with a printed circuit card 12. Printed circuit card 12 has a plurality of conductive pads 14 on the opposite sides thereof spaced from an edge 16 of the card. the pads 14 are connected to traces or other circuit components (not shown) on the card 12 as is known in the art. One of the pads 15 is modified to have an "L-shape". In other words, a reset leg 15a extends generally perpendicularly from one of the pads towards the location where another pad would normally be situated. This reset leg is electrically and mechanically connected to pad 15 and is of sufficient length to extend between adjacent terminals of the edge card connector.

FIGS. 1, 2, 4 and 5 each show only one terminal of an edge card connector for purposes of clarity. It can be seen that the edge card connector depicted in FIG. 3 has terminals 50 on both sides of card slot 20 and such structure is achieved by reversing that of FIGS. 4 and 5.

Edge card connector 10 includes a housing 18 of a dielectric material, such as plastic or the like, with a card slot 20 for receiving edge 16 of printed circuit card 12. The slot may have a chamfered mouth 22 for facilitating insertion of the printed circuit card into the opening. The housing also has a passage 24 for receiving a spring contact member.

The spring contact member of the prior art (FIGS. 1-2) is generally designated 26 and includes a base portion 30 within passage 24, a tail portion 32 extending out from the rear of the passage, and a spring arm portion 34 bent or folded, as at 36, rearwardly over base portion 30 in a generally U-shaped configuration. Spring arm portion 34 has a crest area 34a defining a contact area of the spring contact member for engaging the contact pads 14 of printed circuit card 12. The spring contact member is mounted within housing 18 by insertion into the rear of passage 24 in the direction of arrow "A", until a locking tab 38 snaps behind a shoulder 40 defined in the floor of passage 24 in housing 18. The locking tab prevents the spring contact member from backing out of passage 24 in response to insertion forces of the printed circuit card. Finally, spring arm portion 34 is preloaded within passage 24 of the housing, as indicated by dotted lines 34 which represent the "free" unbiased condition of the spring arm prior to insertion into passage 24.

Figure 1:
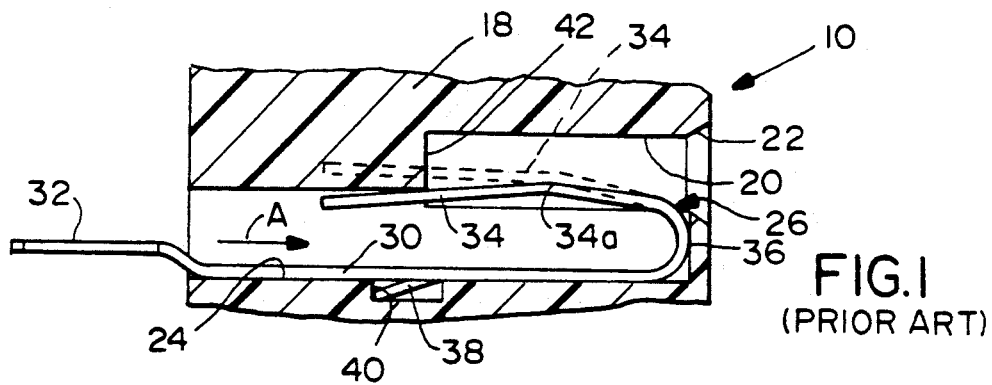
FIG. 1 is a fragmented section through the housing of an edge card connector of the prior art, with only one of the spring contact members thereof shown in its initial preloaded condition.
Figure 2:
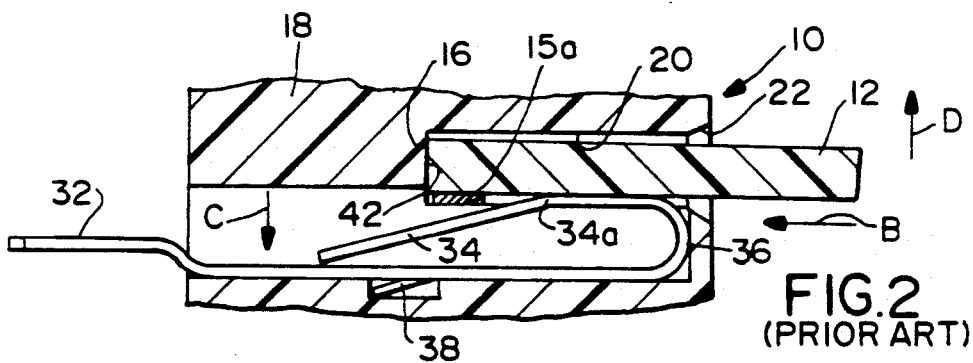
FIG. 2 is a view similar to that of FIG. 1, with a printed circuit card inserted into the connector of the prior art and deflecting the spring contact member.

In operation of the edge card connector and printed circuit card combination of the prior art, as described above in relation to FIGS. 1 and 2, printed circuit card 12 is inserted through mouth 22 and into card slot 20 of housing 18 until edge 16 of the printed circuit card engages spring arm portion 34 of spring contact member 26. Further insertion of the printed circuit card in the direction of arrow "B" (FIG. 2), causes the edge of the printed circuit card to deflect spring arm portion 34 of the contact member downwardly in the direction of arrow "C". The printed circuit card is inserted to its full position as shown in FIG. 2 until edge 16 of the board abuts against a shoulder 42 at the inner end of card slot 20. Contact area 34a of each terminal 26 is then in contact with its respective contact pad 14 in order to complete the desired electrical connection.

During the insertion of printed circuit card 12 into slot 20, leg 15a of contact pad 15 moves across and past contact area 34a of spring arm portion 34 of one of the contact members, momentarily establishing an electrical interconnection between two adjacent contact members that contact leg 15a and pad 15. This momentary interconnection causes a reset signal to be sent to the electronic device in which the card edge connector 10 is located.

Once the printed circuit card is fully inserted into slot 20 as shown in FIG. 2, the underside of the board maintains spring arm portion 34 of the contact member in its deflected condition, but, as seen in FIG. 2, reset leg 15a on a card 12 has moved past the contact area 34a and there is no interconnection therebetween. This action might be considered generally as a momentary switch arrangement.

As stated above, problems are encountered with prior art arrangements as described above in relation to the prior art of FIGS. 1 and 2. More particularly, should inadvertent movement or tilting of printed circuit card 12 occur generally in the direction of arrow "D" (FIG. 2), sufficient force might cause reset pad 15a to engage spring arm portion 34 of spring contact member 26 due to their proximity. Excessive vibrations might also cause this inadvertent interconnection. In the printer application described in the background above, all of the functions of the printer would be reset when such would be very undesirable.

Figure 4:
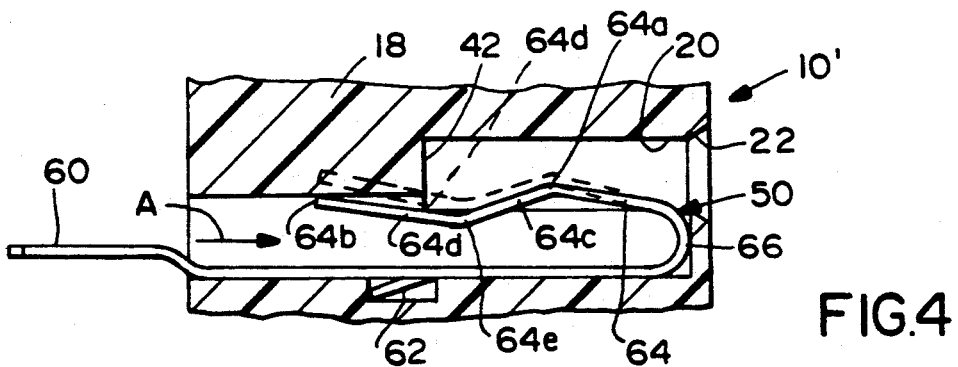
FIG. 4 is a fragmented section, similar to FIG. 1, through the edge card connector of the invention, with the spring contact member thereof in its initial preloaded condition.
Figure 5:
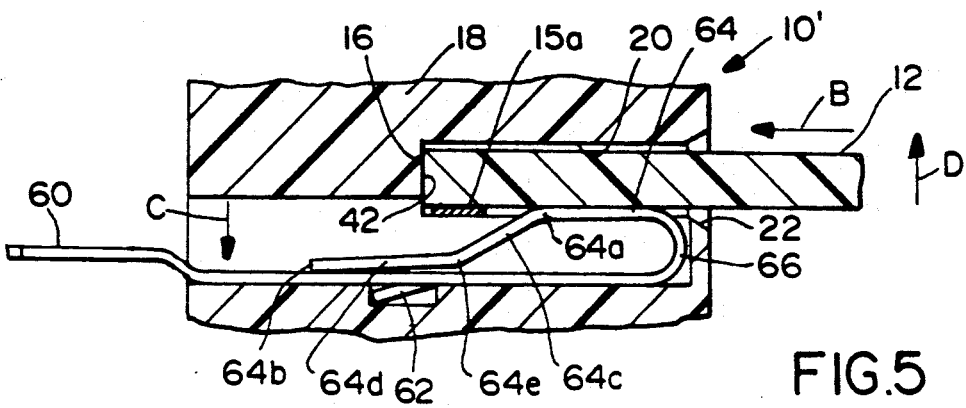
FIG. 5 is a view similar to that of FIG. 4, with a printed circuit card inserted into the connector and deflecting the spring contact member.

The present invention is directed to an improved arrangement wherein such inadvertent or unintentional interconnection is totally obviated. More particularly, FIGS. 3, 4 and 5 show a printed circuit card and the electrical edge card connector of the invention. An edge card connector, generally designated 10', is shown to include a dielectric housing 18 substantially identical to housing 18 in FIGS. 1 and 2. Consequently, like numerals have been applied to like components or areas of the housing as described above. However, the invention contemplates an improved spring contact member, generally designated 50, for use with printed circuit card 12 having a modified contact pad 15 on one side thereof.

Specifically, as with spring contact member 26 (FIGS. 1 and 2), spring contact member 50 includes a base portion 58, a tail portion 60, a locking tab 62 and a spring arm portion 64 bent or folded, as at 66, rearwardly over base portion 58 in a generally U-shaped configuration. Spring arm portion 64 includes a contact area 64a for engaging and establishing contact with contact pads 14 of circuit card 12. The base portion, terminal tail portion and locking tab of spring contact member 50 is substantially identical to spring contact member 26 as described in relation to FIGS. 1 and 2. Again, the spring contact member is preloaded in the housing, as by comparing its free unbiased condition shown by dotted lines in FIG. 4.

However, spring contact 50 of the invention is designed, generally, to have a dog-legged portion extending from contact area 64a to a distal end 64b of spring arm portion 64. The dog-legged configuration defines a down-turned leg 64c and an up-turned leg 64d joined at a low point 64e of the spring arm portion 64 of the contact member. This defines a recessed area of the spring arm portion in the area of low point 64e.

In operation of the invention as described above in relation to FIGS. 3, 4 and 5, printed circuit card 12 is inserted into slot 20 in housing 18 in the direction of arrow "B" (FIG. 5). Edge 56 of the printed circuit card engages spring arm portion 64 of spring contact member 50, causing the spring arm portion to be deflected downwardly in the direction of arrow "C". As the printed circuit card moves toward its fully inserted position, whereat edge 16 engages shoulder 42 of the housing, reset leg 15a moves over contact area 64a of the spring contact member to momentarily establish an electrical interconnection therebetween. When the board is fully inserted, as seen in FIG. 5, reset leg 15a is aligned with the recessed area 64e between down-turned leg 64c and up-turned leg 64d of the spring arm portion of the spring contact member and contact area 64a of each of the terminals contacts its respective pad 14. This alignment makes it practically impossible to establish inadvertent interconnection between reset leg 15a and any portion of the spring contact member. In fact, should printed circuit card 12 be tilted in the direction of arrow "D" under extreme forces, the lower corner of edge 56 of the printed circuit card will engage up-turned leg 64d of the dog-legged configuration, creating a stop, whereupon reset leg 15a cannot come into engagement with the recessed area at low point 64e of the spring arm portion of the contact member.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In an edge card connector having a dielectric housing with a card receiving slot therein for receiving an edge of a circuit card, said housing having a plurality of spring contact members mounted in said housing and spaced along said slot, said circuit card having a plurality of first electrically conductive contact pads located thereon adjacent to said edge with a longitudinal center of each said first contact pad being positioned a first predetermined distance from said edge, first contact pads being in mechanical and electrical contact with said spring contact terminals when said circuit card is received within said connector, said circuit card further including a second electrically conductive contact pad positioned on said circuit card a second predetermined distance from said edge, said first predetermined distance being greater than said second predetermined distance, and wherein one of the spring contact members has a contact portion urged into electrical connection with the second contact pad on the circuit card as the edge of the board is inserted into said opening, wherein the improvement comprises:

said one of the spring contact members having a dog-legged portion extending from the contact portion in the direction of insertion of the circuit card to define a recessed area of the spring contact member facing the card in said slot and wherein the recessed area of the spring contact member is aligned with the second contact pad when the circuit card is fully inserted into the slot in the housing.

2. An electrical connector as set forth in claim 1, wherein said recessed area of the spring contact member is spaced inwardly from a distal end of the contact member for alignment with said second contact pad located inwardly of the edge of the circuit card.

3. An electrical connector as set forth in claim 1, wherein said dog-legged portion of the spring contact member defines a down-turned leg connected to and projecting away from said contact portion and an up-turned leg joined to said down-turned leg in said recessed area.

4. An electrical connector as set forth in claim 3, wherein said up-turned leg contacts a portion of the edge of the circuit card when said card is fully inserted into the slot to define a stop to prevent engagement of the second contact pad with the recessed area of the spring contact member when said card is fully inserted.

5. An electrical connector as set forth in claim 3, wherein all of said spring contact members are generally identically shaped.

6. An electrical connector as set forth claim 1, wherein all of said spring contact members are generally identically shaped.

7. An electrical connector as set forth in claim 6, wherein each of said spring contact members is preloaded against the housing.

8. An electrical connector as set forth in claim 6, wherein each of said spring contact members is preloaded against the housing.

9. In an edge card connector having a dielectric housing with a card receiving slot therein for receiving an edge of a circuit card, said housing having a plurality of identically shaped spring contact members mounted in said housing and spaced along said slot, said circuit card having a plurality of first electrically conductive contact pads located thereon adjacent to and positioned a first predetermined distance from said edge, said first contact pads being in mechanical and electrical contact with a contact portion of said spring contact terminals when said circuit card is received within said connector, said circuit card further including a conductive second contact pad positioned on said circuit card and connected to one of said first contact pads to define an L-shaped contact pad, said L-shaped contact pad being dimensioned so that two adjacent terminals simultaneously contact said L-shaped contact pad when said circuit card is initially inserted into said slot, wherein the improvement comprises:

said spring contact members each having a recessed area along a portion thereof extending from the contact portion in the direction of insertion of the circuit card, said recessed area of the spring contact member being further from said card than said contact portion when the card is inserted in said slot and wherein the recessed area of the spring contact member that is aligned with said second contact pad is aligned with the second contact pad when the circuit card is fully inserted into the slot in the housing.

10. An electrical connector as set forth in claim 9, wherein each of said spring contact members is preloaded against the housing.

11. An electrical connector as set forth in claim 9, wherein said recessed area of the spring contact members is spaced inwardly from a distal end of the contact member for alignment with said second contact pad located inwardly of the edge of the printed circuit card.

12. An electrical connector as set forth in claim 9, wherein said recessed area is a dog-legged portion of the spring contact member defined by a down-turned leg connected to and projecting away from said contact portion and an up-turned leg joined to said down-turned leg.

13. An electrical connector as set forth in claim 12, wherein said up-turned leg contacts a portion of the edge of the circuit card when said card is fully inserted into the slot to define a stop to prevent engagement of the second contact pad with the recessed area of the spring contact member when said card is fully inserted.

14. An electrical connector as set forth in claim 13, wherein each of said spring contact members is preloaded against the housing.

* * * * *